(12) United States Patent
Akahori

(10) Patent No.: US 6,720,659 B1
(45) Date of Patent: *Apr. 13, 2004

(54) SEMICONDUCTOR DEVICE HAVING AN ADHESION LAYER

(75) Inventor: Takashi Akahori, Hachioji (JP)

(73) Assignee: Tokyo Electron Limited, Tokyo-to (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/660,884

(22) Filed: Sep. 12, 2000

Related U.S. Application Data

(63) Continuation of application No. PCT/JP99/02363, filed on May 6, 1999.

(30) Foreign Application Priority Data

May 7, 1998 (JP) .............................................. 10-140584

(51) Int. Cl.⁷ ..................... H01L 21/3213; H01L 23/48; H01L 21/306
(52) U.S. Cl. ........................ 257/762; 257/758; 257/700; 257/701; 257/764; 257/763; 257/751; 257/760; 257/773; 156/652.1; 216/67; 216/75; 438/714; 438/717; 438/720; 438/734
(58) Field of Search ................................. 257/762, 758, 257/700, 701, 774, 751, 759, 760, 763, 764, 767, 773; 156/652.1; 216/67, 75; 438/714, 717, 720, 734

(56) References Cited

U.S. PATENT DOCUMENTS

| | | | |
|---|---|---|---|
| 4,960,751 A | * | 10/1990 | Yamazaki ................. 174/257 |
| 4,985,750 A | | 1/1991 | Hoshino |
| 5,674,355 A | | 10/1997 | Cohen et al. ............ 156/652.1 |
| 5,866,920 A | * | 2/1999 | Matsumoto et al. ........ 257/758 |
| 6,091,081 A | * | 7/2000 | Matsubara et al. ........... 257/52 |
| 6,159,862 A | * | 12/2000 | Yamada et al. ............. 438/712 |
| 6,296,780 B1 | * | 10/2001 | Yan et al. ................... 438/717 |
| 6,329,295 B1 | * | 12/2001 | Matsubara et al. ......... 438/710 |
| 6,429,122 B2 | * | 8/2002 | Chooi et al. ................ 438/637 |

FOREIGN PATENT DOCUMENTS

| | | |
|---|---|---|
| JP | 5-74960 | 3/1993 |
| JP | 5-234987 | 9/1993 |
| JP | 8-236517 | 9/1996 |
| JP | 9-246242 | 9/1997 |
| JP | 9-246264 | 9/1997 |
| JP | 10-335461 | 12/1998 |
| JP | 11-16918 | 1/1999 |

OTHER PUBLICATIONS

Treichel, H. et al., "Low dielectric constant materials for interlayer dielectric (Invited paper)", *Microelectronic Engineering*, 40 (1998), 1–19.

(List continued on next page.)

*Primary Examiner*—Alexander Oscar Williams
(74) *Attorney, Agent, or Firm*—Finnegan, Henderson, Farabow, Garrett & Dunner LLP

(57) ABSTRACT

Insulating films 21 through 24 of CF films (fluorine-contained carbon films) are formed on a substrate (not shown). In addition, Cu wiring layers 25 and 26 are formed on the CF films 21 and 23 via an adhesion layer 29 which comprises a Ti layer and a TiC layer. By forming the insulating films 21 through 24 of CF films, Cu in the wiring layers is prevented from diffusing into the insulating films 21 through 24. The relative dielectric constant of the CF film is smaller than the relative dielectric constant of a BCB film.

7 Claims, 15 Drawing Sheets

OTHER PUBLICATIONS

Murarka, S.P., "Low dielectric constant materials for interlayer dielectric applications", 400 *Solid State Technology*, 39 (1996) Mar., No. 3, Tulsa, OK, US.

Wu, P.K., "XPS Study of Buried Metal/Polymer and Polymer/Metal Interface", Mat. Res. Soc. Symp. Proc. vol. 385 (1995), pp. 79–90.

Clark, D.T. et al., "Surface Modification by Plasma Techniques. I. The Interactions of a Hydrogen Plasma with Fluoropolymer Surfaces", *Journal of Polymer Science: Part A: Polymer Chemistry*, vol. 25, 2643–64 (1987).

Supplementary European Search Report, EP 99 91 8319, dated Jul. 1, 2003.

* cited by examiner

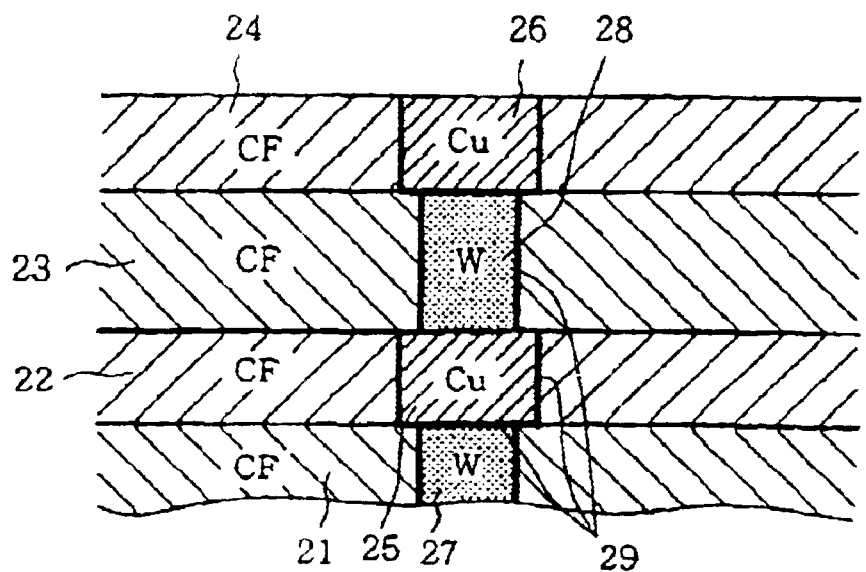
F I G. 1a
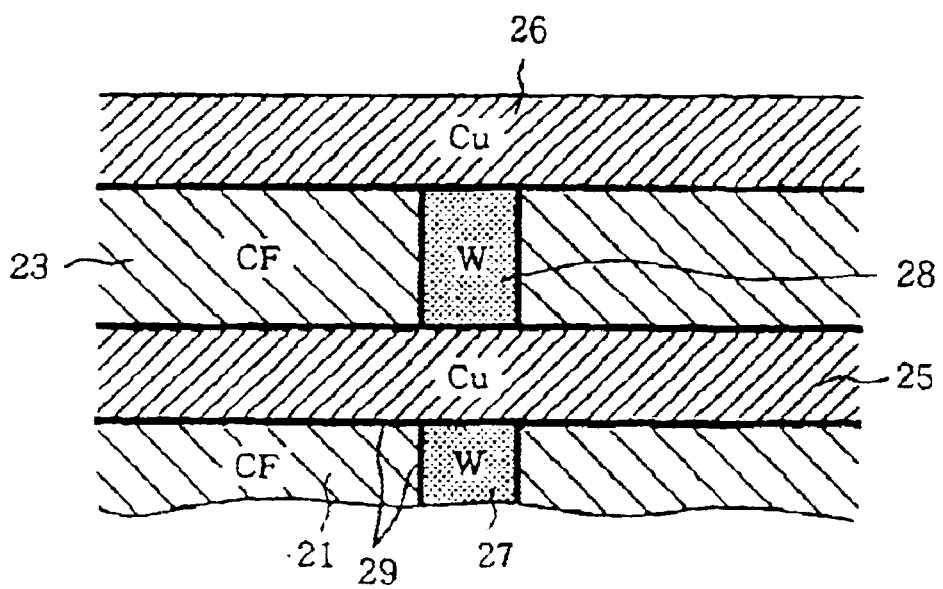
F I G. 1b

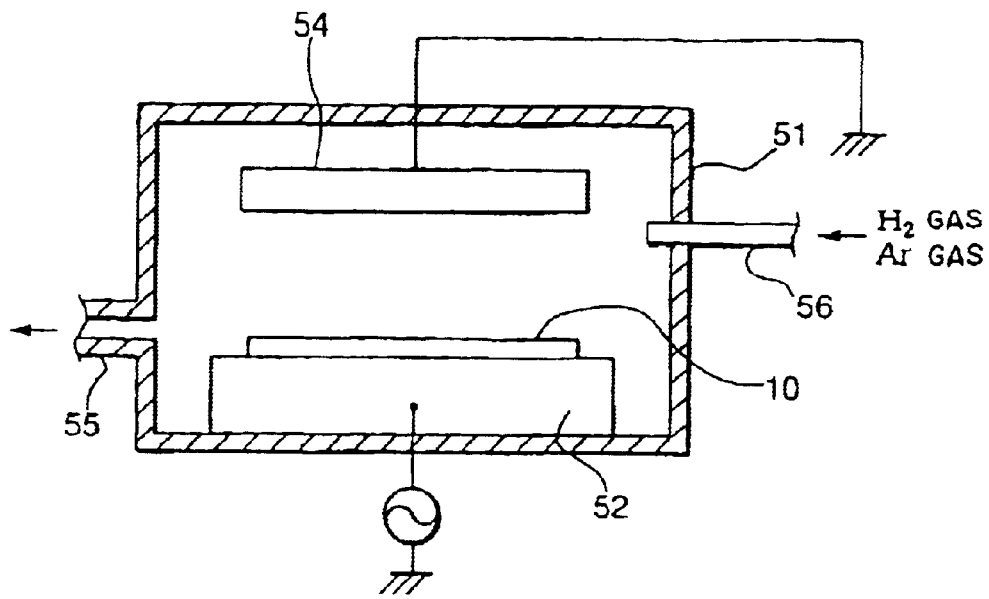
F I G. 6
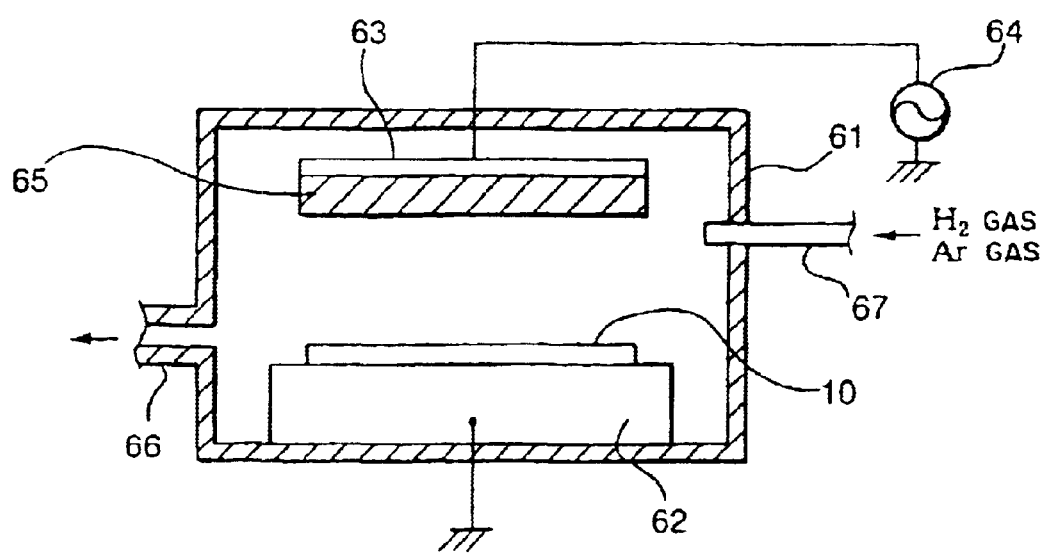
F I G. 7

| Cu | 2000 Å |
|----|--------|
| Ti | 500 Å |
| CF | 5000 Å |
| Si | |
F I G. 8a
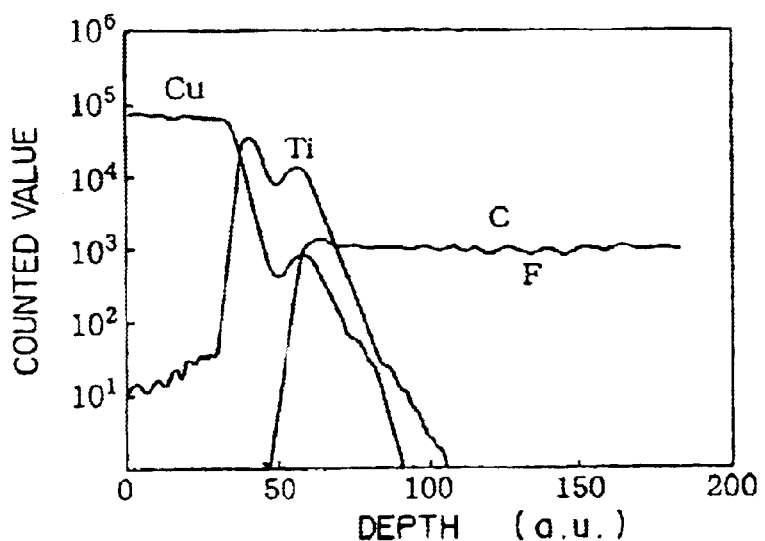
F I G. 8b
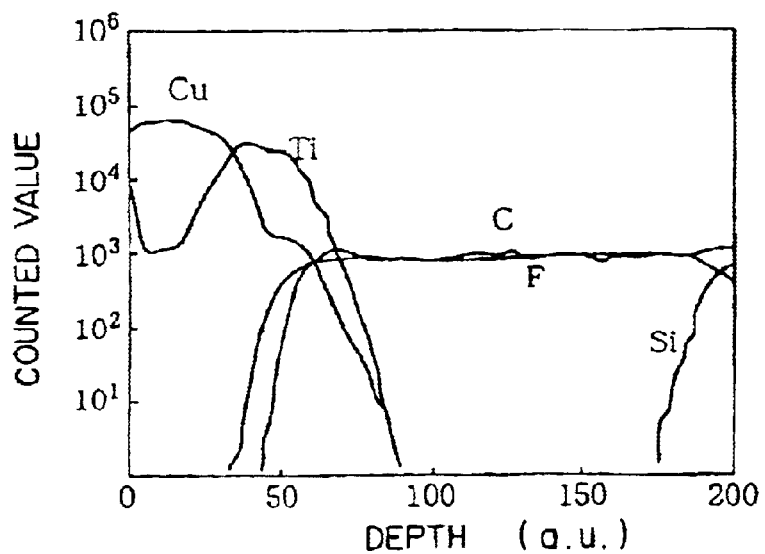
F I G. 8c

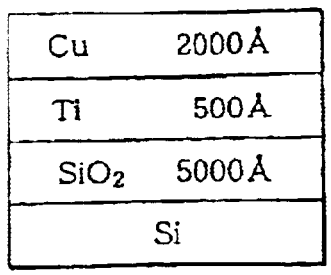
F I G. 9a
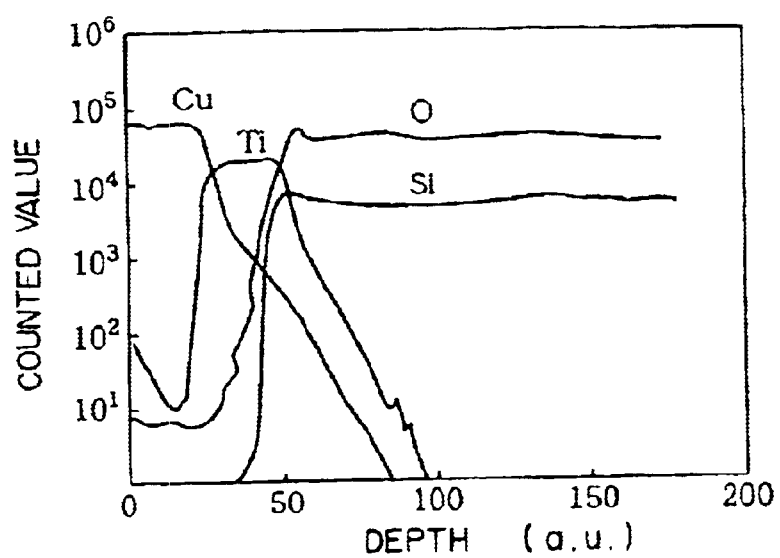
F I G. 9b
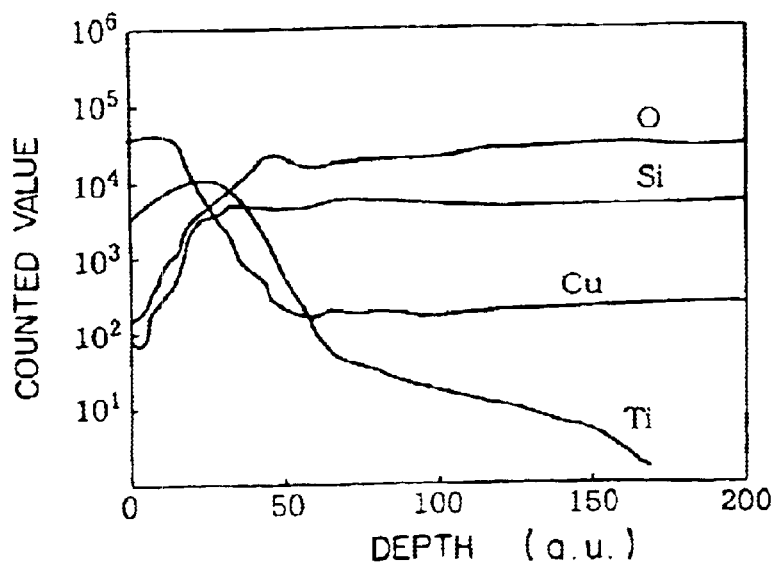
F I G. 9c

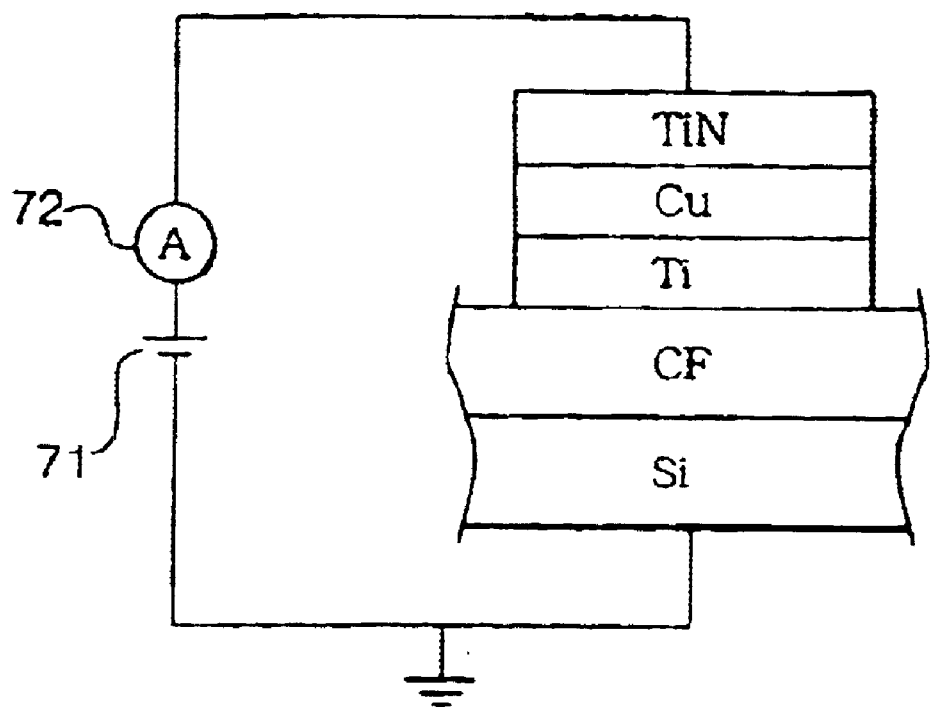
F I G. 10

| BIAS POWER (W) | 0 | 300 | 500 | 1000 | 1500 |
|---|---|---|---|---|---|
| MTTF (hr) | 0.98 | 1.63 | 1.65 | 1.80 | 1.92 |

| AMOUNT OF ADDED $O_2$ (sccm) | 0 | 1 | 2 | 3 | 4 | 5 |
|---|---|---|---|---|---|---|
| MTTF (hr) | 1.92 | 2.13 | 2.11 | 1.90 | 0.84 | 0.65 |

| AMOUNT OF ADDED N2 (sccm) | 0 | 0.5 | 1.0 | 1.5 | 2.0 | 2.5 |
|---|---|---|---|---|---|---|
| MTTF (hr) | 1.92 | 1.81 | 1.70 | 1.65 | 1.55 | 0.78 |

| AMOUNT OF ADDED BF$_3$ (sccm) | AMOUNT OF B IN FILM |
|---|---|
| 0.1 | $5 \times 10^{-4}$ atomic % |
| 0.2 | $10^{-3}$ atomic % |
| 1 | 0.01 atomic % |
| 5 | 0.1 atomic % |
| 10 | 1 atomic % |
| 20 | 2 atomic % |

FIG. 14a

| AMOUNT OF ADDED BF$_3$ (sccm) | 0.1 | 0.2 | 1 | 5 | 10 | 20 |
|---|---|---|---|---|---|---|
| MTTF (hr) | 1.98 | 2.35 | 2.65 | 2.68 | 2.76 | 0.75 |

FIG. 14b

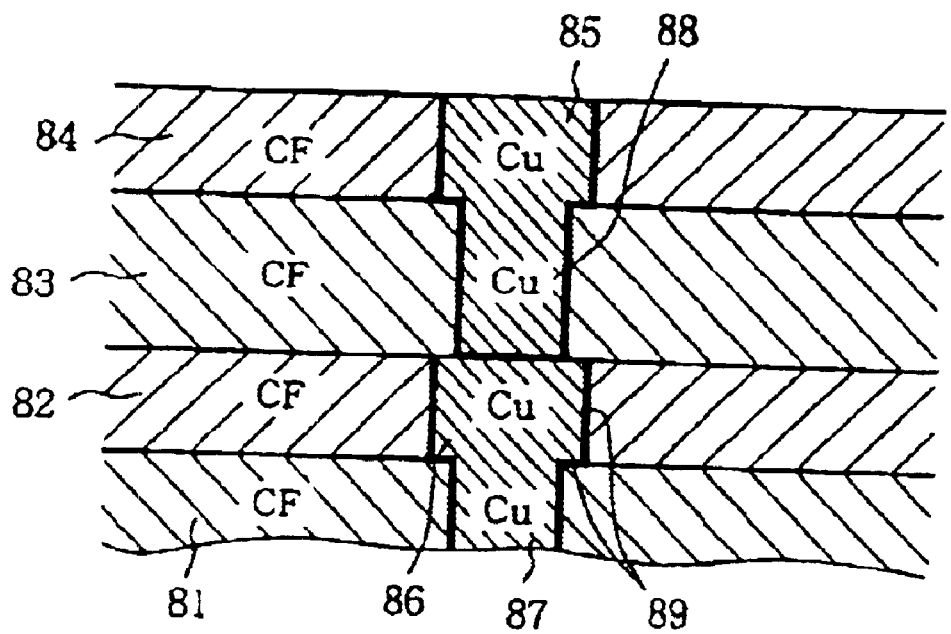
F I G. 16
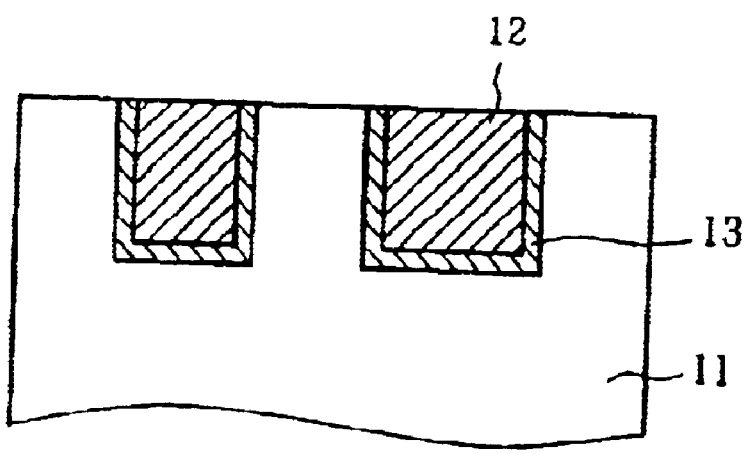
F I G. 17

US 6,720,659 B1

SEMICONDUCTOR DEVICE HAVING AN ADHESION LAYER

This application is a continuation of PCT/JP99/02363, filed May 6, 1999.

TECHNICAL FIELD

The present invention relates to the improvement of an interlayer dielectric film in a semiconductor device which has a multi-layer wiring structure having wiring layers of copper.

BACKGROUND ART

In order to achieve the high-density integration of semiconductor devices, it has been developed to provide devices, such as the scale down of patterns and the multilayering of circuits. As one of such devices, there is a technique for multilayering the wiring layers. In order to provide a multi-layer wiring structure, a number n wiring layer and a number (n+1) wiring layer are connected to each other by means of a conductive layer, and a thin film called an interlayer dielectric film is formed in a region other than the conductive layer.

In general, an $SiO_2$ film is used as the interlayer dielectric film, and an aluminum (Al) layer is used as the wiring layer. However, if the wiring layer of Al is used, its resistance increases in accordance with the scale down of patterns, so that there is a problem in that the fall of potential in a power supply line and the delay of clock signals are uneven to cause malfunction. Since current density flowing through the wiring increases, there is also a problem in that the wiring is broken by electro-migration to deteriorate reliability.

Therefore, it has been studied that copper (Cu), which has a lower resistance than that of Al and which is resistant to electro-migration, is used as the material of the wiring. In this case, since it is difficult to etch Cu, a process utilizing, e.g., the chemical mechanical polishing (CMP) method, is carried out, i.e., Cu is deposited in a hole or groove formed in an insulating film, and then, the CMP is carried out to flatten the surface of the insulating film to form a pattern wiring.

However, Cu is easy to diffuse in silicon (Si) and the $SiO_2$ film. For that reason, when the $SiO_2$ film is used as the insulating film and Cu is used as the material of the wiring, the junction leak of the semiconductor device, the dielectric breakdown of a gate oxide film, and the fluctuation in MOS threshold voltage are caused to have a bad influence on the performance of the semiconductor device.

Therefore, when Cu is used as the material of the wiring layer, it has studied that a barrier film 13 having a thickness of, e.g., about 200 angstroms, is formed between an insulating film 11 and a Cu wiring layer 12 as shown in, e.g., FIG. 17, in order to prevent Cu from diffusing in the semiconductor device. It is considered that Ta, W, TiW, $TiSi_2$, TiN, $Ta_2N$, $W_2N$, $Ni_{0.6}$, $N_{0.4}$, or amorphous Ta—Si—N is used as the material of the barrier film. However, there is a problem in that the producing process for forming the barrier film 13 is complicated, and there is a problem in that it is difficult to select each material of the barrier film 13 since the material of the barrier film 13 has its merits and demerits, respectively.

On the other hand, it also has been studied that the insulating film is formed of a material, in which Cu is difficult to diffuse, in place of the formation of the barrier film. In general, the interlayer dielectric film is formed as an SiOF film, a polyimide film, a PSI (polyimide siloxane) film, a PAE (polyaryleneethers) film, a HSQ (hydrogen silsesquioxanes ($H_3Si_3O_{12}$)) film or a BCB (benzocyclobutene) film, in place of the $SiO_2$ film.

Although it is said that cu does not diffuse in the BCB film of the BCB polymer among these insulating films, it is confirmed that Cu diffuses in the $Sio_2$ film, SiOF film, polyimide film and PSI film. The presence of diffusion of Cu in the PAE film and HSQ film has not been confirmed.

By the way, in recent years, in order to further accelerate the operation of the semiconductor device, it is required to lower the relative dielectric constant of the interlayer dielectric film. That is, the relative dielectric constant of the above described BCB film is about 2.7, so that it is desired to use a material, which has a smaller relative dielectric constant than that of the BCB film and in which Cu does not diffuse, as the insulating film.

DISCLOSURE OF THE INVENTION

The present invention has been made in such circumstances, and it is an object of the present invention to provide a semiconductor device capable of inhibiting Cu, which is the material of a wiring layer, from diffusing in an insulating film by forming the insulating film of a smaller relative dielectric constant than that of the BCB film.

In order to accomplish this object, according to the present invention, a semiconductor device comprises: a substrate; an insulating film of a fluorine-contained carbon film formed on the substrate; and a wiring layer of copper formed on the insulating film.

According to such a semiconductor device, by forming the insulating film of a CF film, it is possible to prevent copper, which is the material of the wiring layer, from diffusing into the insulating film, and the relative dielectric constant of the CF film can be smaller than that of a BCB film.

An adhesion layer may be formed between the insulating film and the wiring layer in order to prevent the wiring layer from being peeled off from the insulating film. In that case, the adhesion layer may comprise a metal layer of a metal, such as titanium, and a layer of a compound which contains carbon and the metal.

In such a semiconductor device, the insulating film is preferably amorphous. From the point of view of further prevention of copper diffusion, the insulating film preferably has a film density of 1.50 g/cm³. From the same point of view, the concentration of oxygen in the insulating film is preferably 3 atomic % or less, and the concentration of boron in the insulating film is preferably in the range of from $10^{-3}$ atomic % to 1 atomic %. Moreover, from the point of view of the improvement of hardness and heat resistance of the insulating film, nitrogen is effectively added, and the concentration of nitrogen in the insulating film is preferably 3 atomic % or less.

BRIEF DESCRIPTION OF THE DRAWINGS

FIG. 1a is a front-side sectional view showing a part of a structure of an example of a semiconductor device according to the present invention;

FIG. 1b is a lateral-side sectional view showing the semiconductor device;

FIG. 6 is a sectional view showing a parallel plate plasma processing system for carrying out an $H_2$ plasma irradiation process;

FIG. 7 is a sectional view showing a sputtering system for carrying out a process for depositing a Ti layer;

FIG. 8a is a schematic sectional view showing the structure of a sample (Example 1) for carrying out the SIMS analysis of a semiconductor device;

FIG. 8b is a graph showing the results of the SIMS analysis after a thin-film deposition process in Example 1;

FIG. 8c is a graph showing the results of the SIMS analysis after an annealing process in Example 1;

FIG. 9a is a schematic sectional view showing the structure of a sample (Comparative Example 1) for carrying out the SIMS analysis of a semiconductor device;

FIG. 9b is a graph showing the results of the SIMS analysis after a thin-film deposition process in Comparative Example 1;

FIG. 9c is a graph showing the results of the SIMS analysis after an annealing process in Comparative Example 1;

FIG. 10 is an illustration for explaining an experiment method for examining electric characteristics of a semiconductor device;

FIG. 14a is a graph showing the relationship between the amounts of $BF_3$ added during a process and the amounts of B in a CF film;

FIG. 14b is a table showing the relationship between the amounts of $BF_3$ added during a process and MTTFs;

FIG. 16 is a sectional view showing a part of a structure of another example of a semiconductor device according to the resent invention; and FIG. 17 is a sectional view showing a part of a conventional semiconductor device.

BEST MODE FOR CARRYING OUT THE INVENTION

Figure 2:
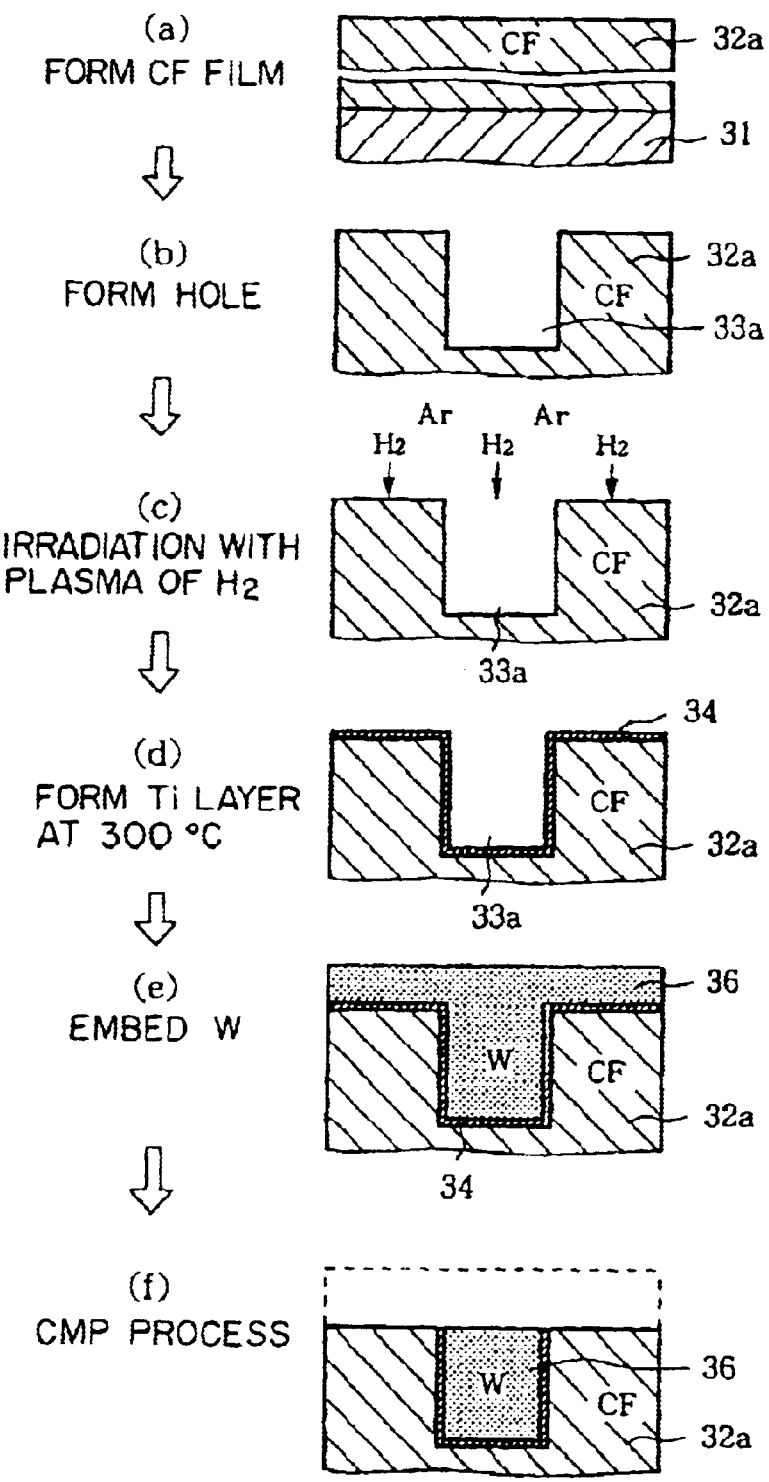
FIG. 2 is a process drawing for explaining a concrete process when a semiconductor device according to the present invention is produced.

A semiconductor device according to the present invention is characterized in that a fluorine-contained carbon film (which will be hereinafter referred to as a "UCF film") is used as an insulating film and that a wiring layer is formed of Cu. Referring to FIGS. 1a and 1b, a concrete structure of such a semiconductor device will be described below. These figures show a part of an example of a semiconductor device. FIG. 1a is a front-side sectional view of the semiconductor device, and FIG. 1b is a lateral-side sectional view of the semiconductor device.

In FIGS. 1a and 1b, reference numbers 21 through 24 denote interlayer dielectric films of CF films having a thickness of, e.g., about 7000 angstroms. Reference numbers 25 and 26 denote wiring layers of Cu layers having a thickness of, e.g., about 7000 angstroms, and reference numbers 27 and 28 denote connection lines of W layers for connecting the Cu wiring layers 25 and 26 to each other. In this example, adhesion layers 29 having a thickness of, e.g., about 200 angstroms, are formed between the CF films 21 through 24 and the Cu wiring layers 25, 26 and W layers 27, 28, and between the W layers 27, 28 and the Cu wiring layers 25, 26. In FIGS. 1a and 1b, the adhesion layer 29 is expressed by a single thick line for convenience.

Figure 3:
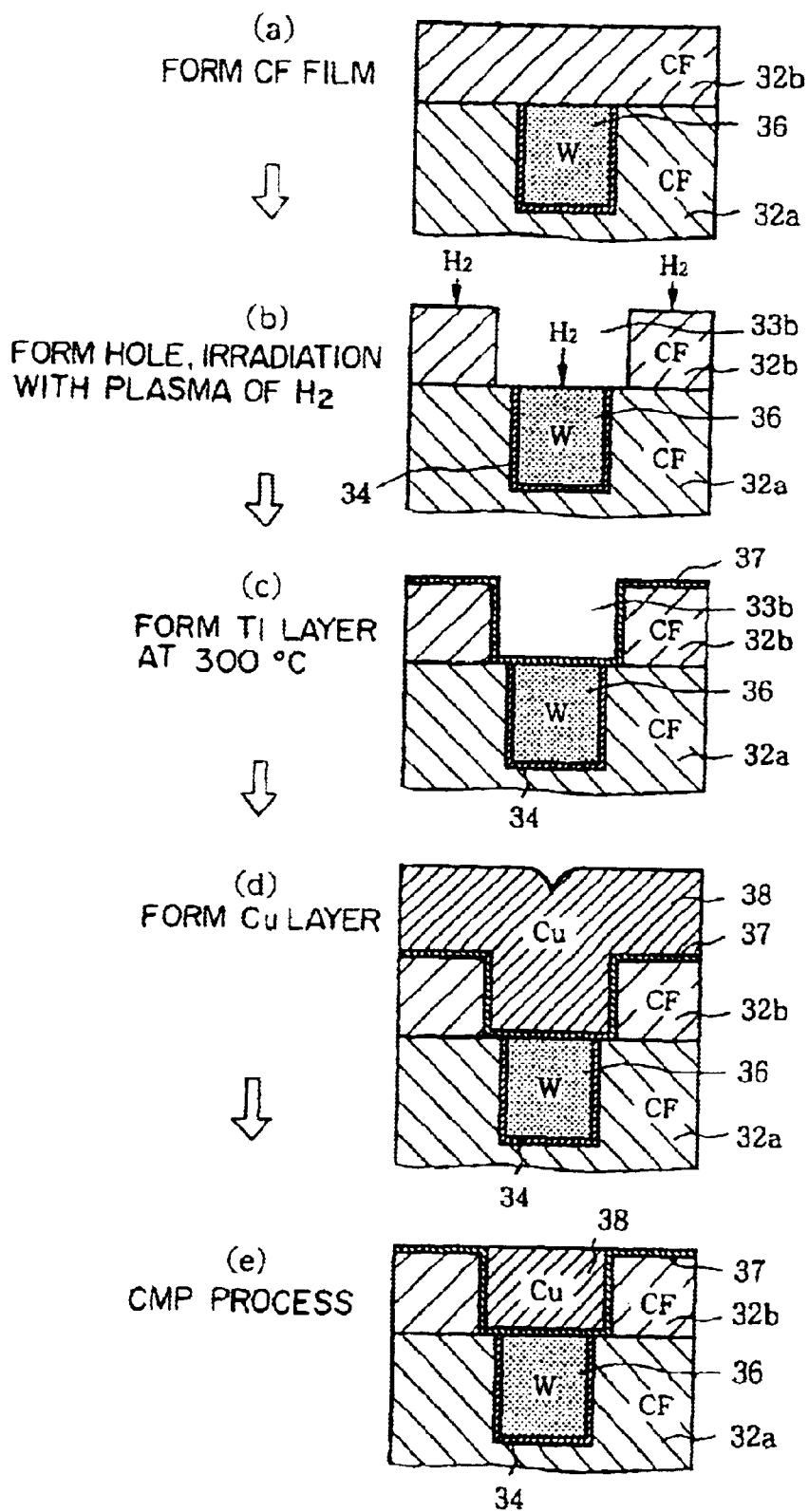
FIG. 3 is a process drawing for explaining a concrete process when a semiconductor device according to the present invention is produced.
Figure 4:
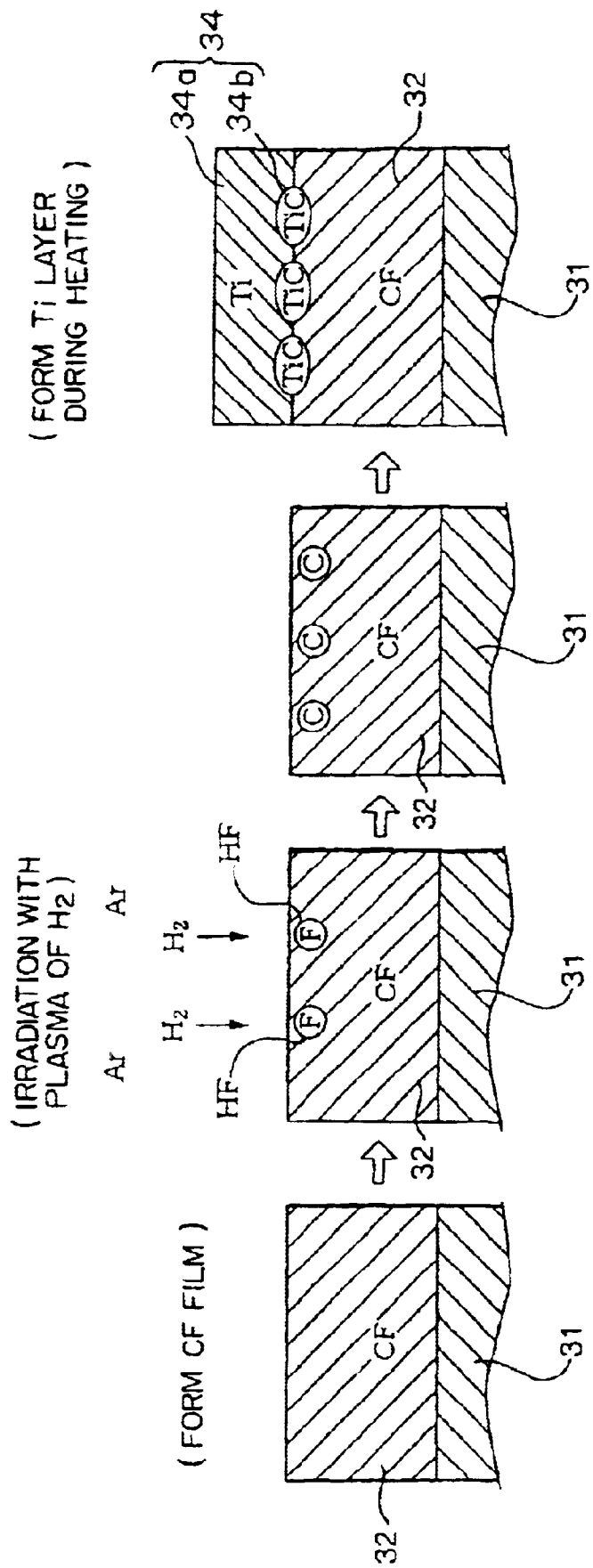
FIG. 4 is a process drawing for explaining the outline of a method for producing a semiconductor device according to the present invention.

Referring to FIGS. 2 through 4, an example of a method for producing such a semiconductor device will be described below. First, as shown in FIG. 2(a), a CF film 32a having a thickness of, e.g., 7000 angstroms, is formed on the surface of a semiconductor substrate 31, such as an Si wafer. This CF film 32a is formed by using, e.g., Ar (argon) gas, as a plasma gas, and, e.g., $C_4F_3$ and $C_2H_4$ gases, as deposition gases, to activate the deposition gases as plasmas in, e.g., an ECR plasma system (see FIG. 5) utilizing the ECR (electron cyclotron resonance) which will be described later.

Subsequently, a process for forming a wiring of W in the CF film 32 is carried out. In this process, a hole 33b for embedding W is first formed in a part of the surface of the CF film 32a, in which the wiring of W is intended to be formed, as shown in FIG. 2(b). This hole 33a is formed by forming a predetermined pattern on the surface of the CF film 32a and by carrying out an etching process in an etching system (not shown).

Thereafter, as shown in FIG. 2(c), the surface of the CF film 32a is irradiated with the plasma of $H_2$. That is, Ar gas and $H_2$ gas are introduced into, e.g., a plasma processing system (see FIG. 6), which will be described later, to activate $H_2$ gas as a plasma to irradiate with the plasma of $H_2$ for, e.g., about 5 seconds. The introduction of Ar gas is carried out in order to facilitate the production of the plasma of $H_2$ and in order to stabilize the plasma. If the irradiation with the plasma of $H_2$ is thus carried out, fluorine (F) in the surface layer portion of the CF film 32a reacts with $H_2$ to fly away from the CF film 32a as HF. For that reason, although the amount of F decreases in the surface layer portion, carbon (c) remains, so that the concentration of C is high.

After the irradiation with the plasma of $H_2$ is thus carried out, a Ti (titanium) layer 34a having a thickness of, e.g., 200 angstroms, is formed on the whole surface of the CF film 32a as shown in FIG. 2(d). That is, the Ti layer 34a is formed on the whole surface of the CF film 32a including the inner wall surface of the hole 33a by sputtering Ti of a target, e.g., by introducing Ar gas into, a sputtering system (see FIG. 7), which will be described later, while the interior of the system is heated at 300° C. or higher.

If the Ti layer 34a is thus formed on the surface of the CF film 32a while heating the substrate 31, C in the surface layer portion of the CF film 32a reacts with Ti in the boundary between the CF film 32a and the Ti layer 34a to form a TiC (a compound containing Ti and C) film 34b having a thickness of, e.g., 50 angstroms, as shown in FIG. 4. In this preferred embodiment, the Ti layer 34a and the TiC layer 34b constitute the adhesion layer 34.

Since it is required to heat both of Ti of the target and the surface of the CF film in order to form the TiC layer 34b, the Ti layer 34a is deposited while the interior of the sputtering system is heated at 300° C. or higher in the above described example. However, in place of this method, after the Ti layer 34a has been deposited at a temperature of, e.g., about 300° C, an annealing process may be carried out at a temperature of 400° C. or higher with respect to the substrate 31, on which the Ti layer 34a has been formed, after the Ti layer 34a has been deposited at a temperature of, e.g., about 300° C.

Then, as shown in FIG. 2(e), a process for forming a W layer 36 on the surface of the adhesion layer 34 to fill the hole 33a with W is carried out. Thereafter, a CMP process (polishing process) is carried out in a CMP system (not shown) to polish and remove an undesired portion of the Ti layer 34a on the surface of the CF film 32a, i.e., a portion of the Ti layer 34a other than the inner wall surface of the hole 33a, as shown in FIG. 2(f). Thus, the hole 33a formed in the CF film 32a is filled with W via the Ti layer 34a to form a connection line of the W layer 36.

Subsequently, a process for forming a Cu wiring layer on the surface of the CF film 32a, in which the connection line of W has been formed, is carried out. In this process, as shown in FIG. 2(a), a CF film 32b having a thickness of 7000 angstroms is first formed on the surface of the CF film 32a, in which the connection line of W has been formed, by the same method as that in FIG. 2(a). Then, as shown in FIG. 2(b), a groove 33b is formed in the surface of the CF film, in which a wiring of Cu is intended to be formed, by the same method as that in FIG. 2(b). Then, this surface is irradiated with the plasma of $H_2$. This process is carried out in, e.g., the same manner as that in FIG. 2(c), to irradiate the surface with the plasma of $H_2$ for, e.g., about 5 seconds. subsequently, as shown in FIG. 2(c), an adhesion layer 37 comprising the Ti layer and the TiC layer is formed on the whole surface of the CF film 32b. This process is carried out in, e.g., the same manner as that in FIG. 2(d), to form the adhesion layer 37 having a thickness of, e.g., 200 angstroms. Then, as shown in FIG. 2(d), a Cu layer (Cu wiring layer) 38 having a thickness of, e.g., about 7000 angstroms, is formed on the surface of the Ti layer 37. Thereafter, as shown in FIG. 2(e), the surface is polished by a CMP system (not shown). Thus, a semiconductor device having a multi-layer wiring structure is produced.

Figure 5:
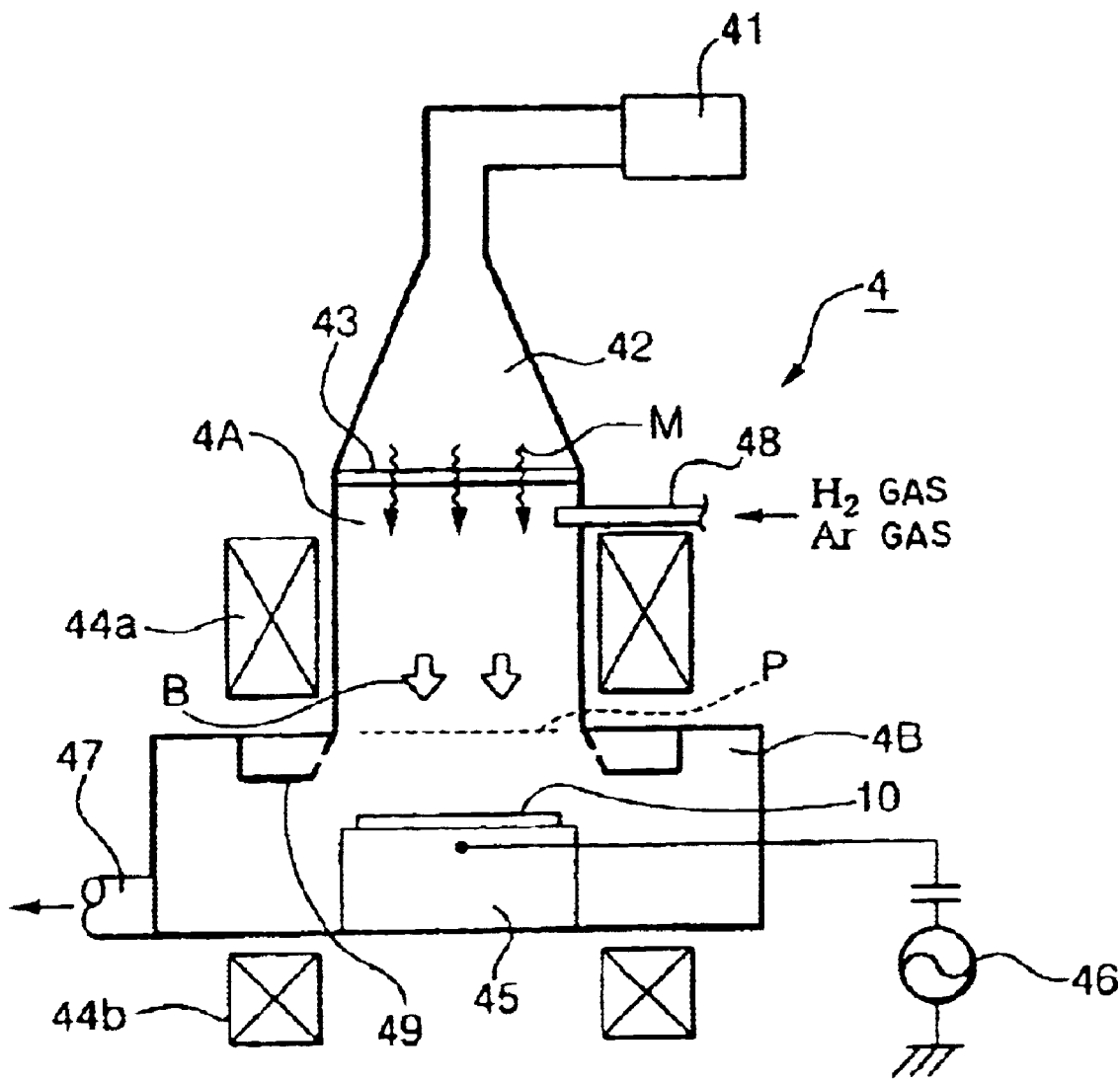
FIG. 5 is a sectional view showing an ECR plasma system for carrying out a process for depositing a CF film.

Referring to FIGS. 5 through 7, an ECR plasma system for carrying out an ECR plasma process, a plasma processing system for carrying out the irradiation with the plasma of $H_2$, and a sputtering system for forming a Ti layer will be briefly described below.

First, an ECR plasma system shown in FIG. 5 has a vacuum vessel 4 comprising a plasma chamber 4A and a deposition chamber 4B. A high frequency wave (microwave) M of, e.g., 2.45 GHz, is designed to be supplied into the vacuum vessel 4 from a high frequency power supply part 41 via a waveguide 42 and a transmission window 43. A magnetic field B extending from the plasma chamber 4A toward the deposition chamber 4B is formed by a main electromagnetic coil 44a and an auxiliary electromagnetic coil 44b, which are provided around the plasma chamber 4A and above and below the deposition chamber 4B, respectively. The intensity of the magnetic field B in the vicinity of an ECR point P is, e.g., 875 gausses. Then, by the interaction between the magnetic field B and the microwave M, an electron cyclotron resonance is caused at the ECR point P.

When the CF film is formed by this system, a semiconductor wafer (which will be hereinafter referred to as a "wafer") 10 serving as a substrate is mounted on a supporting table 45 which is provided in the deposition chamber 4B, and a bias voltage is applied to the supporting table 45 by means of a high frequency power supply part 46. Then, while the vacuum vessel 4 is evacuated via an exhaust pipe 47, Ar gas serving as a plasma gas is introduced into the plasma chamber 4A via a plasma gas supply pipe 48, and a deposition gas is introduced into the deposition chamber 4B via a deposition gas supply part 49 to activate the deposition gas as a plasma by the electron cyclotron resonance. This system can carry out the irradiation with the plasma of $H_2$. In that case, $H_2$ gas and Ar gas are introduced into the plasma chamber 4A to activate $H_2$ gas as a plasma by the electron cyclotron resonance.

A system shown in FIG. 6 is a parallel plate plasma processing system for carrying out the irradiation with the plasma of $H_2$. In FIG. 6, reference number 51 denotes a process chamber, 52 denotes a supporting table which serves as a bottom electrode connected to a high frequency power supply part 53, and 54 denotes a grounded top electrode which is provided so as to face the supporting table 52. In this system, a wafer 10 is mounted on the supporting table 52, and a high frequency power is applied between the supporting table 52 and the top electrode 54 to produce plasma. Then, while the process chamber 51 of this system is evacuated via an exhaust pipe 55, $H_2$ gas and Ar gas are supplied into the process chamber 51 via a gas introducing pipe 56 at predetermined flow rates, respectively, to activate $H_2$ gas as a plasma to irradiate the surface of the CF film on the wafer 10 with the plasma of $H_2$ for, e.g., about 5 seconds.

A system shown in FIG. 7 is a parallel plate plasma processing system for carrying out the deposition of the CF film. In FIG. 7, reference number 61 denotes a process chamber, 62 denotes a supporting table which serves as a grounded bottom electrode, 63 denotes a top electrode which is connected to a high frequency power supply part 64 and is provided so as to face the bottom electrode 62, and 65 denotes a target of Ti which is provided on the bottom surface of the top electrode 63. In this system, a high frequency power is applied between the supporting table 62 and the top electrode 63, while the interior of the process chamber 61 is heated at, e.g., 300° C., to produce plasma. Then, while the process chamber 61 of this system is evacuated via an exhaust pipe 66, Ar gas is supplied into the process chamber 61 via a gas introducing pipe 67 at predetermined flow rates to activate Ar gas as a plasma to sputter the target 65 with the plasma. Thus, Ti is deposited on the CF film of the wafer 10 which has been mounted on the supporting table 62.

In the semiconductor device thus produced, Cu does not diffuse into the CF film as can be clearly seen from the results of experiment which will be described later, so that it is possible to inhibit Cu from diffusing into the CF films 32a and 32b, which are insulating films, even if the wiring layer 38 is formed of Cu. Therefore, it is possible to inhibit an element from being damaged due to the diffusion of cu into the insulating films, so that it is possible to enhance the reliability of the semiconductor device and to improve the quality of the semiconductor device.

Since Cu does not diffuse into the CP films 32a and 32b which are insulating films, it is not required to provide any barrier layers for preventing Cu from diffusing into the insulating films, or it has only to provide a very thin barrier layer. Moreover, since the CF films 32a and 32b have a low relative dielectric constant of 2.5, it is possible to obtain a semiconductor device corresponding to the scale down and accelerating by using the CF films 32a and 32b as the insulating films.

Moreover, since the adhesion layer is formed between the Cu wiring layer 38 and the CF films 32a, 32b in the semiconductor device according to the present invention, the adhesion between the CF films 32a, 32b and the Cu wiring layer 38 is enhanced, so that it is possible to inhibit the Cu wiring layer 38 from being peeled off from the CF films 32a and 32b. If a metal layer of Cu or the like is formed directly on the CF film, there is the possibility that F in the CF film reacts with the metal to form a metal fluoride in the boundary between the CF film and the metal layer. Then, since this metal fluoride generally has low sublimation and melting points, the metal fluoride is melted or sublimed if the substrate is heated to a temperature of the sublimation or melting point or higher in the subsequent process, so that there is the possibility that the metal fluoride is peeled off from the CF film.

On the other hand, if the adhesion layers 34 and 37 are formed between the CF films 32a, 32b and the Cu wiring layer 38 as this preferred embodiment, the TiC layer 34b is not peeled off from the CF films 32a and 32b. Because TiC is stable without being vaporized or melted even in a process, in which the substrate 31 is heated to a high temperature, since the TiC layer 34b formed between the Ti layer 34a and the CF films 32a, 32b has a high melting point of 3267° C. in an example of the adhesion layer 34 shown in FIG. 4. The TiC layer 34b is not peeled off from the CP films 32a and 32b. The Ti layer 34a in the adhesion layer 34 is difficult to be peeled off from the Cu wiring layer 38 and the W layer 36 since these layers are metal layers. As a result, it is possible to inhibit the CF films 32a and 32b from being peeled off from the Cu wiring layer 38 and the W layer 36, so that it is possible to obtain a semiconductor device having high reliability.

Since the conductivity of the TiC layer 34b is 61 $\mu\Omega$·cm, the Cu wiring layer 38 is electrically connected to the W layer 36 even if the TiC layer 34b exists between the CF film 32a, 32b and the Cu wiring layer 38. For that reason, when the Cu wiring layer 38 and the W layer 36 are formed, it is not required to peel off the TiC layer 34b. As the metal of the adhesion layer may be W, Mo (molybdenum), Cr (chromium), Co (cobalt), Ta (tantalum), Nb (niobium) or Zr (zirconium) in place of Ti. Because fluorides of W or Mo have a melting point of 20° C. or less and fluorides of Cr and Co have a melting point of about 100° C. or less, whereas carbon compounds of these metals have a melting point of about 2000° C. to about 4000° C. and carbon compounds of Ta, Nb and Zr have a very high melting point.

An example of experiment, which was carried out in order to confirm the presence of diffusion of Cu into a CF film, will be described below. First, the structure of a sample, which was used in this experiment, will be described. As shown in FIG. 8, this sample comprises a CF film having a thickness of 5000 angstroms, a Ti layer having a thickness of 500 angstroms, and a Cu layer having a thickness of 2000 angstroms which are deposited on a silicon substrate in that order (Example 1).

The CF film and the Ti layer were produced as follows. First, Ar gas, $C_4F_3$ gas and $C_3H_4$ gas were introduced into the ECR plasma system shown in FIG. 5, at flow rates of 150 sccm, 40 sccm and 30 sccm, respectively. Then, the CF film was deposited on the silicon substrate at a microwave power (the high frequency power supply part 41) of 2.7 kW at a bias power (the high frequency power supply part 46) of 1.5 kW at a substrate temperature of 400° C.

Then, $H_2$ gas and Ar gas were introduced into the ECR plasma system at flow rates of 300 sccm and 30 sccm, respectively, to irradiate the surface of the CF film with the plasma of $H_2$. At this time, the microwave power was 2700 W, and the bias power was 0 W. Thereafter, the sputtering system shown in FIG. 7 was used for introducing Ar gas at a flow rate of 50 sccm at a temperature of 300° C. to deposit the Ti layer on the surface of the CF film. At this time, the power of the high frequency power supply part 64 was 1200 W.

With respect to the sample (Example 1) thus obtained, the amounts of Cu, Ti, CF and Si were analyzed by the SIMS (secondary ion mass spectroscopy). The same analysis was carried out by the SIMS with respect to the sample after an annealing process was carried out at 425° C. for 1 hour. Moreover, as a comparative experiment, the same experiment was carried out with respect to a sample (Comparative Example 1) wherein the CF film of the sample in Example 1 was replaced with an $SiO_2$ film as shown in FIG. 9(a).

The results in Example 1 and Comparative Example 1 are shown in FIGS. 8b and 8c and FIGS. 9b and 9c, respectively (FIGS. 8b, and 9b show the results of SIMS analysis after a thin-film deposition process, and FIGS. 8c and 9c show the results of SIMS analysis after an annealing process). In the graphs of these figures, the axis of abscissas denotes depths (unit: a.u.) in the sample, and the axis of ordinates denotes the number (counted number) of ions, such as Cu ions. As can be seen from these graphs, in the case of Example 1, there were obtained the results of analysis that Cu and Ti exist at depths (~about 3.8 a.u., ~about 47 a.u.) corresponding to the Cu and Ti layers after the annealing process, whereas only C and F exist and Cu does not exist at depth (about 94 a.u.~) corresponding to the CF film on the side of the Si substrate. Thus, it was observed that no diffusion occurs between Cu and the CF film although diffusion occurs between Cu and Ti, that is, Cu does not diffuse into the CF film although Cu diffuses into the Ti layer.

On the other hand, in the case of Comparative Example 1, there were obtained the results of analysis that the amount of Cu is less than the amounts of Si and O at a depth corresponding to the CF layer after the thin-film deposition process, whereas Si, O, Cu and Ti are mixed after the annealing process. Thus, it was observed that Cu diffuses into the Ti layer to further diffuse into the $SiO_2$ film.

With respect to the sample in Example 1, a tape was stuck on the top face of the Cu layer, and the tape was peeled off. It was confirmed with the naked eye whether peeling occurred between the CF film and the Ti layer when the tape was peeled off, so that no peeling was observed. Moreover, the relative dielectric constant of the CF film of the sample in Example was measured, so that it was 2.5 which was lower than about 4 of the $SiO_2$ film and about 2.7 of the BCB film.

Then, an example of experiment, which was carried out in order to confirm the electric characteristics of a semiconductor device, will be described. First, the structure of a sample, which was used for the experiment, will be described. As shown in FIG. 10, this sample comprises a CF film having a thickness of 5000 angstroms, a Ti layer having a thickness of 50 angstroms, a Cu layer having a thickness of 2000 angstroms, and a TiN layer having a thickness of 200 angstroms, which are deposited on a silicon substrate in that order (Example 2).

In this sample, the silicon substrate was electrically connected to the TiN layer as shown in FIG. 10. Then, a voltage of 1 MV/cm was applied to the sample while the silicon substrate was heated at 275° C., and the time (which will be hereinafter referred to as "MTTF") until the CF film was short-circuited (until 0.1 A/cm$^2$) was measured. In FIG. 10, reference number 71 denotes a power supply part, and 72 denotes an ampere meter. A portion between the silicon substrate and the power supply part 71 was grounded.

As a comparative experiment, the same experiment was carried out with respect to a sample (Comparative Example 2) wherein the CF film of the sample in Example 2 was replaced with an SiO$_2$ film having the same thickness as shown in FIG. 10.

The length of the MTTF depends on the degree of diffusion of Cu into the CF film and Sio$_2$ film which are insulating films. That is, if the MTTF is long, the amount of Cu diffusing into the insulating films is small, and the capacity for preventing the diffusion of Cu is high. The TiN layer was formed on the top face of the Cu layer in order to prevent the Cu layer from being oxidized.

As the results of the above described experiment, it was confirmed that the MTTF in Example 2 was 1.92 hours, whereas the MTTF in Comparative Example 2 was 0.25 hours, so that when the CF film was used as the insulating film, the MTTF was far longer than that when the SiO$_2$ film was used. Therefore, it was confirmed from this experiment that cu is very difficult to diffuse into the CF film although it is easy to diffuse the SiO$_2$ film.

In order to confirm the crystallinity of a CF film having the same composition as that in Example 1, an X-ray diffraction was measured. As a result, it was not possible to detect any Bragg peaks (Bragg reflections) exhibiting the presence of crystallinity, so that it was confirmed that the CF film is a amorphous material. The expression "amorphous materials" means a microcrystal having a crystallite size of less than 50 to 100 angstroms. In the semiconductor device according to the present invention, since the CF film serving as the insulating film is amorphous and formed by a microcrystal having a crystalline size of less than 50 to 100 angstroms, it is guessed that Cu is difficult to pass through the CF film so that the capacity for preventing the diffusion of Cu is high.

Figures 11A, 11B:
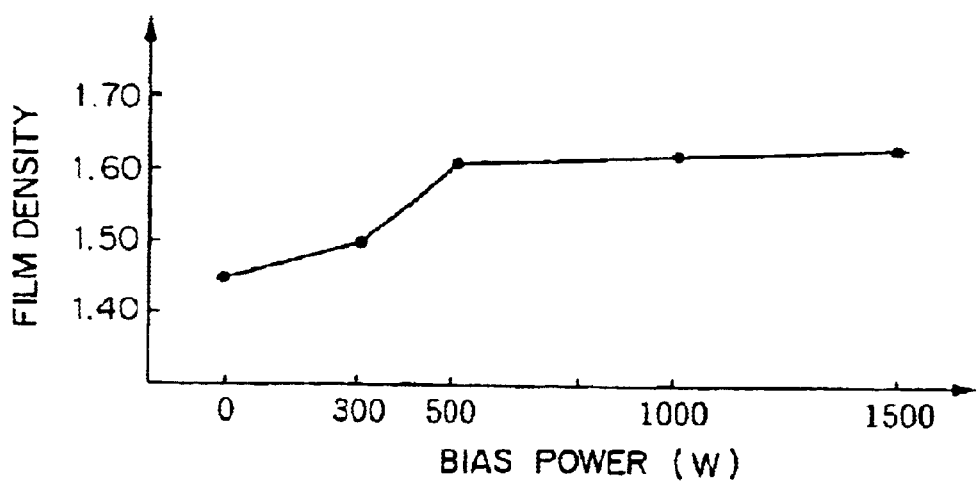
FIG. 11a is a graph showing the relationship between the film densities of a CF film and bias powers.
FIG. 11b is a table showing the relationship between the film densities of a CF film and MTTFs.

In the semiconductor device according to the present invention, the film density of the CF film serving as the insulating film is preferably 1.50 g/cm$^3$ or higher in order to further enhance the capacity for preventing the diffusion of Cu. The inventors have studied a process for increasing the density of a CF film by changing a bias power which is applied to the substrate 31 in the above described ECR plasma system. As a result, the relationship between the magnitude of the bias power and the density of the formed CF film is shown in FIG. 11a, so that it was confirmed that the denseness of the CF film increases as the bias power increases.

As deposition conditions, there were set a flow rate of Ar gas of 150 sccm, a flow rate of C,F, gas of 40 sccm, a flow rate of C$_2$H$_4$ gas of 30 sccm and a microwave power of 2.7 kW. Then, the bias power was gradually changed, and the MTTFs of the CF film were measured at the respective bias powers. Then, the results shown in FIG. 11b were obtained, and it was observed that the MTTF was 1.63 hours or more when the bias power was 300 W or higher. As shown in FIG. 11a, when the bias power was 300 W, the film density of the CF film was about 1.50 g/cm$^3$.

From these results, it can be seen that when the film density of the CF film is 1.50 g/cm$^3$ or higher, the MTTF is long and the capacity for preventing the diffusion of Cu is high, so that such a CF film is effectively used as an insulating film. It is guessed that the reason why the MTTF is long when the film density of the CF film is 1.50 g/cm$^3$ or higher is that when the film density of the CF film increases so that the film is dense, Cu is difficult to pass through the film so that the capacity for preventing the diffusion of Cu is high.

Figures 12A, 12B:
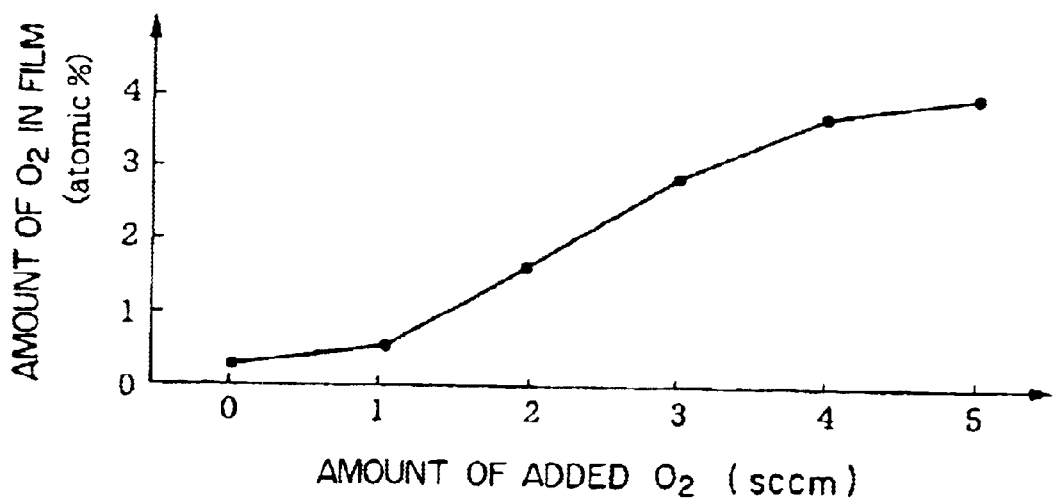
FIG. 12a is a graph showing the relationship between the amounts of $O_2$ added during a process and the amounts of $O_2$ in a CF film.
FIG. 12b is a table showing the relationship between the amounts of $O_2$ added during a process and MTTFs.

In the semiconductor device according to the present invention, the amount (concentration) of oxygen (O$_2$) in the CF film serving as the insulating film is preferably 3 atomic % or less in order to further improve the capacity for preventing the diffusion of Cu. The inventors have studied a process for adding O$_2$ to the CF film in order to improve the pressure resistance of the semiconductor device. As a result, it was observed that the amount of O$_2$ in the obtained CF film can be controlled by adding O$_2$ gas during a thin-film deposition process in the above described ECR plasma system, and that as shown in FIG. 12a, the amount of O$_2$ in the formed CF film increases as the amount of the added O$_2$ gas increases.

As deposition conditions, there were set a flow rate of Ar gas of 150 sccm, a flow rate of C$_2$Fgas of 40 sccm, a flow rate of C$_2$H$_4$ gas of 30 sccm, a microwave power of 2.7 kW and a bias power of 1.5 kW, and O$_2$ gas was introduced from the deposition gas supply part 49. Then, the relationship between the amount of the added O$_2$ gas and the MTTF of the obtained CF film was examined. Then, the results shown in FIG. 12b were obtained, and it was observed that the MTTF was 1.90 hours or more when the amount of the added O$_2$ gas was 3 sccm or less. As shown in FIG. 12a, when the amount of the added O$_2$ gas was 3 sccm, the amount of O$_2$ in the CP film was about 3 atomic %.

From these results, it can be seen that when the amount of O$_2$ in the CF film is 3 atomic % or less, the MTTF is long and the capacity for preventing the diffusion of Cu is high, so that such a CF film is effectively used as an insulating film.

It is considered that the reason why the MTTF is long when the amount of O$_2$ in the CF film is 3 atomic % or less is as follows. That is, since part of double bonds between carbons (C=C) are cut by oxygen when O$_2$ is added during a thin-film deposition process, current is difficult to flow, so that the MTTF increases. However, if the amount of O$_2$ in the CF film is too large, it is guessed that oxygen intends to form CuO to draw Cu into the CF film, so that Cu is easy to diffuse into the CF film.

Figures 13A, 13B:
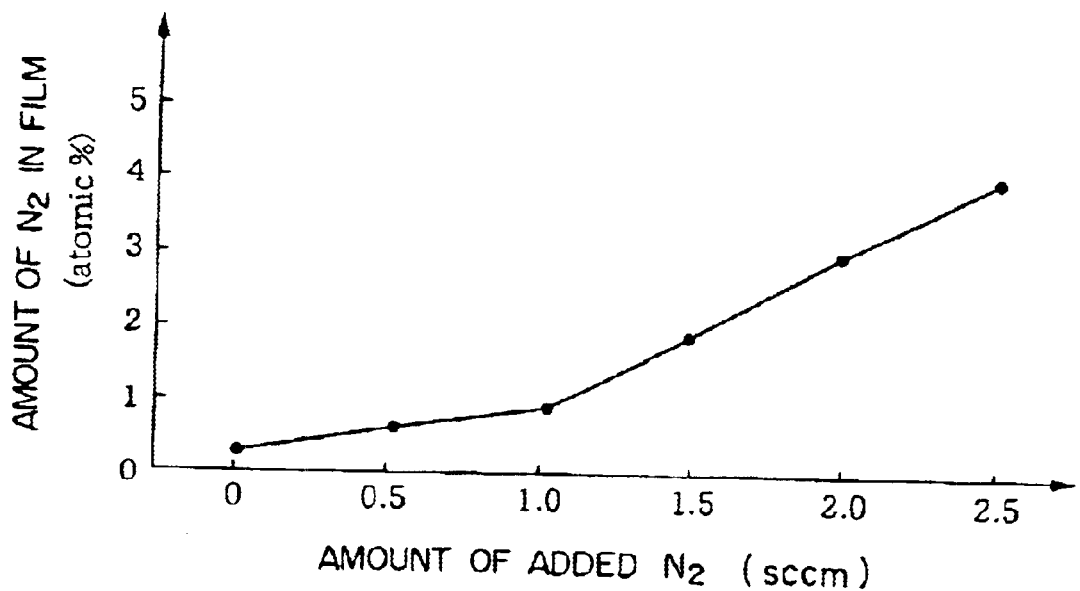
FIG. 13a is a graph showing the relationship between the amounts of $N_2$ added during a process and the amounts of $N_2$ in a CF film.
FIG. 13b is a table showing the relationship between the amounts of $N_2$ added during a process and MTTFs.

Moreover, in the semiconductor device according to the present invention, it is effective to add nitrogen (N$_2$) to the CF film from the point of view of the increase of hardness and heat resistance of the CF film serving as the insulating film, whereas the amount (concentration) of N$_2$ in the CF film is preferably 3 atomic % or less. The inventors have studied a process for adding N. to the CF film in order to improve the hardness and heat resistance of the CF film. As a result, it was observed that the amount of N$_2$ in the obtained CF film can be controlled by adding N$_2$ gas during a thin-film deposition process in the above described ECR plasma system, and that the amount of N$_2$ in the formed CF film increases as the amount of the added N$_2$ gas increases (see FIG. 13a).

As deposition conditions, there were set a flow rate of Ar gas of 150 sccm, a flow rate of C$_4$F$_3$ gas of 40 sccm, a flow rate of C$_3$H$_4$ gas of 30 sccm, a microwave power of 2.7 kw and a bias power of 1.5 kW, and $N_2$ gas was introduced from the deposition gas supply part 49. On the other hand, the relationship between the amount of the added $N_2$ gas and the MTTF of the obtained CP film was examined. Then, the results shown in FIG. 13b were obtained, and it was observed that the MTTF was 1.55 hours or more when the amount of the added $N_2$ gas was 2 sccm or less. AB shown in PIG. 13a, when the amount of the added $N_2$ gas was 2 sccm, the amount of $N_2$ in the CF film was about 3 atomic %.

From these results, it can be seen that when the amount of $N_2$ in the CF film is 3 atomic % or less, the MTTF is long and the capacity for preventing the diffusion of Cu is high. The heat resisting temperature was about 450° C. when the amount of $N_2$ in the CF film was 0 atomic %, whereas the heat resisting temperature was about 590° C. when the amount of $N_2$ was 3 atomic %. Moreover, the hardness was about 2.0 GPa when the amount of $N_2$ in the CF film was 0 atomic %, whereas the hardness was about 2.8 GPa when the amount of $N_2$ was 3 atomic % (the hardness was defined in accordance with Journal of materials Research, vol. 7, Number 6, 1992). Thus, it was observed that a CN film having high heat resistance and hardness was partially formed by adding $N_2$, so that it was possible to increase the heat resistance and hardness of the whole insulating film to effectively use such an insulating film.

It is considered that the reason why the MTTF is long when the amount of $N_2$ in the CF film is 3 atomic % or less is that C=C bonds are cut by N to be —C—N so that current is difficult to flow. It is also guessed that the reason why the MTTF is shortened when the amount of $N_2$ in the CF film is too large is that the addition of excessive $N_2$ inhibits most of bonds in the network of —C—C—to increase the dangling bonds (unbonded part) of C to allow the dangling bonds to attract Cu, such as Cu—C, so that Cu is easy to diffuse into the CF film. The relative dielectric constant of the CN film is higher than that of the CF film, and the relative dielectric constant of the whole insulating film increases as the amount of the CN film increases, so that the amount of $N_2$ in the CF film is preferably 3 atomic % or less.

Moreover, in the semiconductor device according to the present invention, the amount (concentration) of boron (B) in the CP film serving as the insulating film is preferably in the range of from $10^{-1}$ atomic % to 1 atomic % in order to improve the capacity for preventing the diffusion of Cu. The inventors have studied a process for adding B to the CP film in order to improve the pressure resistance of the semiconductor device. As a result, it was observed that the amount of B in the obtained CF film can be controlled by adding $BF_3$ gas during a thin-film deposition process in the above described ECR plasma system, and that as shown in FIG. 14a, the amount of B in the formed CF film increases as the amount of the added $BF_3$ gas increases.

As deposition conditions, there were set a flow rate of Ar gas of 150 sccm, a flow rate of $C_4F_3$ gas of 40 sccm, a flow rate of $C_2H_4$ gas of 30 sccm, a microwave power of 2.7 kW and a bias power of 1.5 kW, and $BF_3$ gas was introduced from the deposition gas supply part 49. Then, the relationship between the amount of the added $BF_3$ gas and the MTTF of the obtained CF film was examined. Then, the results shown in FIG. 14b were obtained, and it was observed that the MTTF was long when the amount of the added $BF_3$ gas was 10 sccm or less, particularly when the amount of the added $BF_3$ gas was in the range of from 0.2 sccm to 10 sccm. As shown in FIG. 14a, when the amount of the added $N_2$ gas was 10 sccm, the amount of B in the CF film was 1 atomic %; and when the amount of the added $N_2$ gas was 0.2 sccm, the amount of B was $10^{31\ 3}$ atomic %.

From these results, it can be seen that when the amount of B in the CF film is 1 atomic % or less, particularly when the amount of B in the CF film is in the range of from $10^{-3}$ atomic % to 1 atomic %, the MTTF is 2.35 hours or more and the capacity for preventing the diffusion of Cu is high, so that such an insulating film is effectively used.

It is considered that the reason why the MTTF is long when the amount of B in the CF film is 1 atomic % or less is as follows. That is, if C having a dangling bond exists in the CF film, Cu is easy to be electrically attracted by the dangling bond, so that Cu is easy to diffuse into the CF film. 10 Therefore, if B is added to the CF film, C having the dangling bond is bonded to B to increase the amount of the dangling bond. As a result, Cu is difficult to diffuse, and the MTTF increases. On the other hand, since the leak current decreases if the amount of B in the CF film is too large, it is guessed that the CF film is conductive, so that the MTTF is shortened.

The amounts of C, F, Si, B and O in the CF film, to which B was thus added, were analyzed by the SIMS. In this experiment, there were used samples wherein a CP film having a thickness of 5000 angstroms was deposited on a silicon substrate and wherein $BF_3$ gas was added to the CP film at a flow rate of 1 sccm (Example 3) and at a flow rate of 5 sccm (Example 4). As deposition conditions, there were set a flow rate of Ar gas of 150 sccm, a flow rate of $C_4F_3$ gas of 40 sccm, a flow rate of $C_2H_4$ gas of 30 sccm, a microwave power of 2.7 kW and a bias power of 1.5 kW.

Figure 15A:
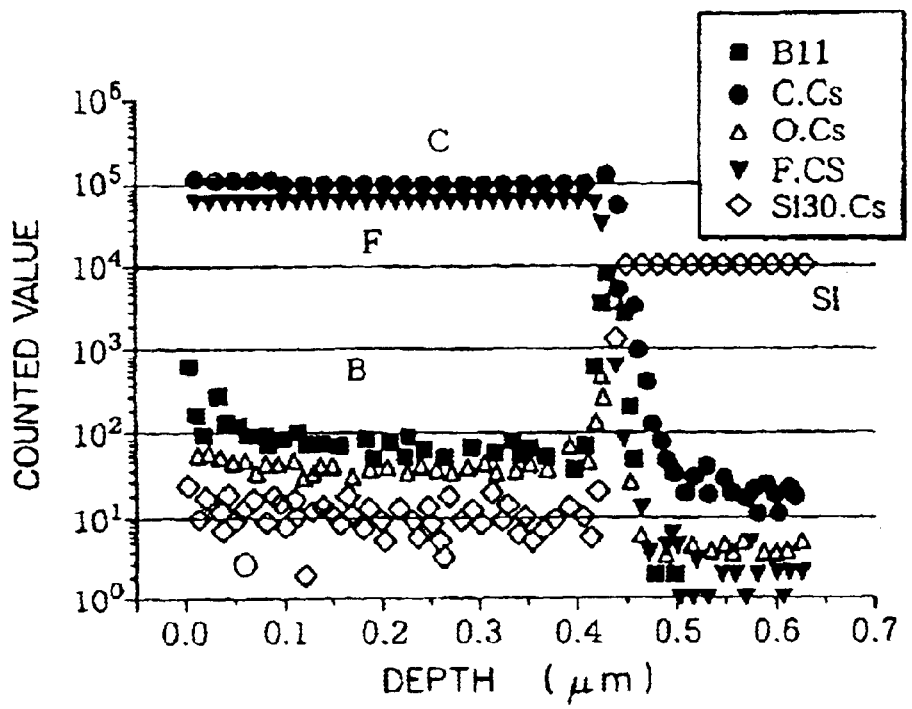
FIG. 15a is a graph showing the results of an SIMS analysis with respect to a semiconductor device (Example 3)
Figure 15B:
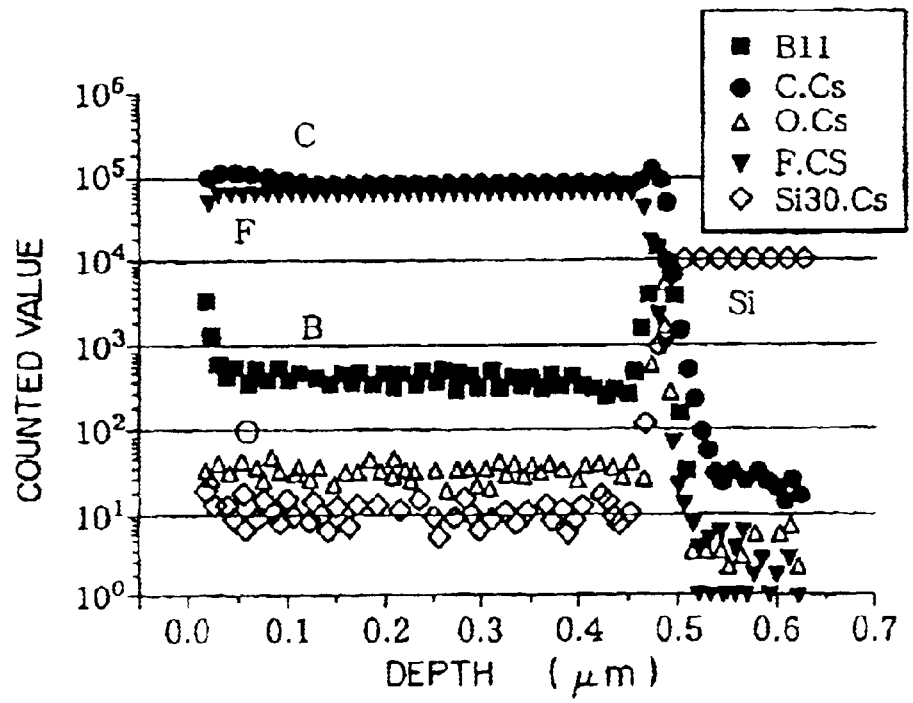
FIG. 15b is a graph showing the results of an SIMS analysis with respect to a semiconductor device (Example 4)

The results in Example 3 are shown in FIG. 15a, and the results in Example 4 are shown in FIG. 15b. In these figures, the axis of abscissas denotes depths (unit: a.u.) in the sample, and the axis of ordinates denotes the number (counted number) of ions, such as Cu ions. It can be seen from these results that the amounts of B in the CF film in Example 4 is greater than that in Example 3 to form a larger number of CB bonds, so that the MTTF in Example 4 is longer than that in Example 3.

A semiconductor device according to the present invention may be formed as shown in FIG. 16. In this device, in FIG. 16, reference numbers 81 through 84 denote interlayer dielectric films of CF films, and 85 and 86 denote Cu wiring layers. Connection lines for connecting the Cu wiring layers 85 and 86 to each other are formed of Cu layers 87 and 88. In FIG. 16, reference number 89 denotes adhesion layers which are formed between the CF films 81 through 84 and the Cu wiring layers 85 through 88. In the semiconductor device according to the present invention, it is not required to provide the adhesive layers if there is a technique for causing the CF films to adhere to the Cu wiring layers.

Moreover, in the method for producing the semiconductor device according to the present invention, the above described irradiation with the plasma of $H_2$ may be carried out by, e.g., the ECR plasma system shown in FIG. 5. The Ti layer may be deposited by the CVD (chemical vapor deposition) or the like. In this case, $TiCl_4$ gas and $H_2$ gas are used as deposition gases to form the Ti layer on the surface of the CF films by a chemical reaction $TiCl_4 + H_2\ Ti \rightarrow HCl$.

What is claimed is:

1. A semiconductor device comprising:

a substrate;

an insulating film of a fluorine-contained carbon film formed on said substrate, wherein the surface of said insulating film is irradiated with hydrogen plasma;

a wiring layer of copper formed on said insulating film;
and an adhesion layer formed between said Insulating film and said wiring layer, for preventing said wiring layer from being peeled off from said insulating film, wherein said adhesion layer includes
a metal layer of a metal disposed adjacent said wiring layer, and
a layer of a compound containing carbon and said metal disposed adjacent said insulating film.

2. A semiconductor device as set forth in claim 1, wherein said metal layer is formed of an element selected from the group consisting of titanium, molybdenum, chromium, cobalt, tantalum, niobium and zirconium.

3. A semiconductor device as set forth in claim 1 or claim 2, wherein said insulating film is amorphous.

4. A semiconductor device as set forth in claim 1 or claim 2, wherein said insulating film has a film density of 1.5 $g/cm^3$ or higher.

5. A semiconductor device as set forth in claim 1 or claim 2, wherein said insulating film contains oxygen having a concentration of 3 atomic % or less.

6. A semiconductor device as set forth in claim 1 or claim 2, wherein said insulating film contains nitrogen having a concentration of 3 atomic % or less.

7. A semiconductor device as set forth in claim 1 or claim 2, wherein said insulating film contains boron having a concentration of from $10^{-3}$ atomlc % to 1 atomic %.

* * * * *